United States Patent [19]
Lan et al.

[11] Patent Number: 6,021,921
[45] Date of Patent: Feb. 8, 2000

[54] LIQUID DISPENSING SYSTEM AND METHOD FOR DISPENSING

[75] Inventors: Ho-Ku Lan; Chen-Cheng Kuo; Hung-Chih Chen; Shih-Shiung Chen, all of Hsin-Chu, Taiwan

[73] Assignee: Taiwan Semiconductor Manufacturing Co., Ltd., Hsin-Chu, Taiwan

[21] Appl. No.: 08/957,913

[22] Filed: Oct. 27, 1997

[51] Int. Cl.[7] ........................................................ B67D 5/08
[52] U.S. Cl. ............................ 222/61; 222/64; 222/394; 137/205; 137/209
[58] Field of Search .................................. 222/1, 61, 64, 222/263, 325, 397, 399, 394, 481.5; 137/205, 209

[56] References Cited

U.S. PATENT DOCUMENTS

| | | | |
|---|---|---|---|
| 4,601,409 | 7/1986 | DiRegolo | 222/1 |
| 4,676,404 | 6/1987 | Yamazaki et al. | 222/61 |
| 5,636,762 | 6/1997 | Juhalo et al. | 222/64 |
| 5,868,278 | 2/1999 | Chen | 222/61 |

*Primary Examiner*—Philippe Derakshani
*Attorney, Agent, or Firm*—Tung & Associates

[57] ABSTRACT

The present invention discloses a liquid dispensing system and a method for dispensing liquid that includes two hermetically sealed tanks each having a liquid container with a conduit pipe connecting the two containers. A differential pressure exists between the two tanks such that a process liquid can be fed from the second container into a dispensing nozzle under the differential pressure and the gravity of the liquid without the need of a pumping system. The problems of gel formation normally observed in conventional dispensing systems can be eliminated. A high viscosity, short shelf life liquid can be most suitably dispensed by the present invention novel dispensing system and method.

25 Claims, 1 Drawing Sheet

LIQUID DISPENSING SYSTEM AND METHOD FOR DISPENSING

FIELD OF THE INVENTION

The present invention generally relates to an apparatus and a method for dispensing a process liquid and more particularly, relates to an apparatus and a method for dispensing a process liquid for semiconductor processing that has high viscosity and short lifetime by pneumatic pressure and gravity without the need for a pump.

BACKGROUND OF THE INVENTION

In the fabrication of semiconductor integrated circuit (IC) devices, hundreds of fabrication steps must be performed on a semi-conducting substrate in order to complete the fabrication of such devices. The hundreds of processing steps may include cleaning, deposition, etching, buffer coating and various other necessary steps. In these fabrication steps, a variety of process chemicals, including liquids and gases must be used in different processing machines and be transported from their storage tanks to the machines. A large number of these process liquids are of high viscosity and short shelf life and therefore their transportation between a reservoir and a process machine must be carefully controlled. Deterioration or premature reaction of these process liquids can result in poor quality products and unnecessary machine down time which in turn lead to a decrease in process yield.

One of the more difficult to transport process liquid is a polyimide material that is frequently used as a moisture barrier or a buffer coating. Polyimide has also been used as a popular material to provide $\alpha$-particle protection for memory circuits. It is known that soft errors in memory circuits are frequently caused by $\alpha$-particles emanating from packaging materials used on the circuits. The $\alpha$-particles are generally believed to be emitted by the decay of uranium and thorium atoms which are contained as impurities in the packaging materials for the IC devices. In recent years, decreasing device design rules make IC circuits more sensitive to the $\alpha$-particle emission problem. Since $\alpha$-particles have low penetrating power in a solid material, polyimide has been successfully used as $\alpha$-absorbing coatings on memory devices.

Polyimides belong to a class of organic polymeric compounds that are derived from imidization reactions of amines and organic acids. The polyimides can be used in a similar manner as spin-on-glass materials by spinning and curing a highly viscus compound to produce a planar surface on a wafer for passivation or for buffer coating. It has been broadly used in recent years, aside from its $\alpha$-particle absorbing characteristics, to realize its benefits of ease of deposition, flexibility in composition, planarity as a spun film, good temperature endurance, excellent weathering and mechanical wear, low pin hole density and dielectric constant, and low absorption of water when compared to a spin-on-glass material for passivation. Polyimide films are successfully used as inter-level dielectrics and protective overcoating layers on top of an IC device. When used as a protective overcoating layer, it is normally deposited to a thickness of between about 50 Å and about 1,000 Å. As a protective overcoating layer, polyimide further has the benefit of acting as a stress relief layer when covered by a plastic molding compound in a packaging operation.

A conventional method for transporting a process liquid by pneumatic pressure alone is shown in FIG. 1. The liquid dispensing system 10 consists mainly of a supply tank 12 which is normally constructed of stainless steel for chemical resistance and mechanical strength. A liquid container 16 is positioned inside the supply tank 12 with its top open to the cavity 14 of the tank. A high pressure dry air 18 is fed into cavity 14 through a first conduit 20 controlled by a valve 22 connected to a vent 24. Liquid 26 having a top surface 28 exposed to the high pressure dry air is pushed into a second conduit 32 through a second valve 34 to an outlet 36 connected to a nozzle (not shown) for dispensing. The second valve 34 is further connected to a drain pipe which can be used to drain the process liquid 26 when bubbles are observed in the liquid flow.

The liquid dispensing system 10 is operated by pneumatic pressure only and no pump means is employed. As such, even though it has the benefit of a less complicated hardware requirement, it is difficult to accurately control the quantity of liquid it dispenses. Furthermore, the pneumatic pressure system generates air bubbles easily in the liquid 26 which reduces the system efficiency. More defects can be generated when more bubbles are introduced during a replacement of an empty bottle. There is no effective means for controlling the bubble formation or disposing of the bubbles from the system contained in apparatus 10.

Furthermore, when the supply bottle 16 is empty, an operator must replace with a new bottle and the operation of the coating machine must be stopped during such replacement. The efficiency of the process is therefore suffered due to the down time of the machine. Another disadvantage of the pneumatic feed apparatus is that in order to get rid of the bubbles in the liquid flow, a large volume of liquid must be drained. It is known that most processing liquids used in the semiconductor processing industry are very expensive, the draining of large quantity of liquids in order to eliminate bubbles therefore involves a large and undesirable expense. Even with the large volume draining of liquid that contains bubbles, micro-bubbles are still in existence and are normally small enough to go through dispensing nozzles and be deposited on top of a substrate causing the formation of a poor quality coating.

In another conventional method for dispensing process liquid, as shown in FIG. 2, a pump feed apparatus is utilized. The dispensing apparatus 40 consists of a supply tank 42 which is normally constructed of a chemical resistant material such as stainless steel. In the cavity 44 of the supply tank 42, a liquid container 46 for holding a process liquid 48 is positioned. A high pressure dry air supply 50 is used to pressurize the cavity 44, and through an open top in the liquid container 46, to pressurize the surface 52 of the liquid 48 contained in the container 46. The high pressure dry air 50 is supplied to the cavity 44 through a first conduit 54 controlled by a valve 56 which is also vented through a vent 58 to the atmosphere. A second buffer tank 60 which may also be constructed of a chemical resistant material such as stainless steel is used to store liquid 62 transported from the first container 46.

The transportation of liquid between the supply tank 42 and the buffer tank 60 is achieved by a second conduit 64 which is in fluid communication with both containers 46 and 60. The buffer tank 60 is further equipped with a vent 66 and an outlet conduit 68 for feeding to a pump 70. The pump 70, is most likely electrically operated moves liquid 62 through a pumping action through a filter 72 and conduit 74 to a dispensing nozzle (not shown). The pumping apparatus 40 shown in FIG. 2 solves the deficiencies of the pressure feed apparatus 10 shown in FIG. 1 by providing a more accurate flow rate control or quantity of liquid delivered by the dispensing nozzle.

Furthermore, by using an intermediate tank, i.e., the buffer tank 60, the process machine need not be shut down when the first container bottle 46 empties and must be replaced. However, there are several disadvantages of the pump feeding apparatus 40. For instance, the pump feeding apparatus 40 is complicated in its construction and therefore is difficult to maintain. Furthermore, since a stepping motor is used for the pump, there is always a small chamber space in the pump that acts as a dead space cumulating a small pool of the pumped liquid. When the pumped liquid has a short shelf life, such as that of a polyimide overcoating material, a highly viscus gel is produced by a premature reaction (or polymerization) in the dead space. The gel formation causes contamination problems and poor accuracy of the pumping action which requires the pump be serviced more frequent than its regular periodic maintenance schedule required. The maintenance cost for a pump feed apparatus 40 is therefore substantially higher than desired.

It is therefore an object of the present invention to provide a liquid dispensing system that does not have the drawbacks or shortcomings of the conventional liquid dispensing systems.

It is another object of the present invention to provide a liquid dispensing system that does not require the operation of a pump for dispensing such liquid.

It is a further object of the present invention to provide a liquid dispensing system that utilizes a differential pressure between a supply tank and a buffer tank, and gravity of the liquid for dispensing through a dispensing nozzle.

It is another further object of the present invention to provide a liquid dispensing system used in semiconductor processing machines that is especially suitable for dispensing liquids that have high viscosity and short shelf life.

It is still another object of the present invention to provide a liquid dispensing system that is equipped with a conduit in fluid communication with a first container and a second container wherein the conduit is further equipped with a bubble sensing means and a bubble release valve.

It is yet another object of the present invention to provide a liquid dispensing system for use in semiconductor processing wherein a buffer tank made of a material that is permeable to air but not to liquid is utilized to prevent the gel formation in the liquid dispensed.

It is still another further object of the present invention to provide a liquid dispensing system for use in semiconductor processing machines that utilizes a dispensing container that has an inclined bottom for easy feeding of the liquid to a dispense nozzle by gravity.

It is yet another further object of the present invention to provide a liquid dispensing system for use in semiconductor processing machines wherein the pneumatic pressure in the first supply tank is higher than that in the second buffer tank such that liquid can be fed through a conduit to a dispensing nozzle.

It is still another further object of the present invention to provide a method for dispensing a liquid to a semiconductor processing machine by utilizing a differential pressure between a supply tank and a buffer tank such that air bubble formation in the liquid can be minimized and the liquid can be fed to a dispensing nozzle by the differential pressure and gravity of the liquid without using a pump.

It is still another further object of the present invention to provide a liquid dispensing system utilizing an inclined and sharp discharging tip of a conduit to reduce bubble retention in a buffer tank.

SUMMARY OF THE INVENTION

In accordance with the present invention, a liquid dispensing system and a method for dispensing is disclosed in which a first supply tank and a second buffer tank are utilized by maintaining a differential pressure between the two tanks such that the formation of air bubbles in the liquid can be minimized and the liquid can be dispensed through a nozzle by the differential pressure and by gravity without requiring a pump. The system and the method can be used for dispensing any process liquid, but is particularly suitably for use in dispensing a process liquid that is highly viscous and has a short shelf life.

In a preferred embodiment, a liquid dispensing system is provided which includes a first tank hermetically sealed under a first pneumatic pressure, a first container that is situated in the first tank for holding a liquid under the first pneumatic pressure, a second tank that is hermetically sealed under a second pneumatic pressure which is smaller than the first pneumatic pressure, a second container situated inside the second tank for holding the liquid under the second pneumatic pressure, a first conduit for fluid communication between the first container and the second container, and an inclined bottom in the second container for dispensing the liquid by gravity through a second conduit connected to the lowest point in the inclined bottom.

In another preferred embodiment, a liquid dispensing system for dispensing a high viscosity liquid is provided which includes a first tank hermetically sealed under a first pneumatic pressure and equipped with means for pressurizing and for venting the tank, a first container that is situated in the first tank for holding a liquid under the first pneumatic pressure, a second tank that is hermetically sealed under a second pneumatic pressure which is smaller than the first pneumatic pressure and is equipped with means for pressurizing and venting the tank, a second container situated inside the second tank for holding the liquid under a second pneumatic pressure equipped with an inclined bottom and a discharging conduit at the lowest point of the inclined bottom, and a conveying conduit for providing fluid communication between the first container and the second container equipped with a vent valve and a first shut-off valve.

The present invention is further directed to a method for dispensing a liquid to a semiconductor process machine which can be carried out by the operating steps of first pressurizing a first hermetically sealed tank to a first pneumatic pressure, then pressurizing a second hermetically sealed tank to a second pneumatic pressure lower than the first pneumatic pressure, the second tank has a second container situated therein for receiving a liquid through a first conduit from the first container and subjecting the liquid to the second pneumatic pressure, and dispensing the liquid by gravity from a second conduit in fluid communication with the lowest point of an inclined bottom of the second container.

BRIEF DESCRIPTION OF THE DRAWINGS

These and other objects, features and advantages of the present invention will become apparent from the following detailed description and the appended drawings in which:

FIG. 3A is an enlarged view of the discharging tip on the end of the conveying conduit.

DETAILED DESCRIPTION OF THE PREFERRED EMBODIMENT

The present invention provides a liquid dispensing system for dispensing a process liquid to a semiconductor process machine that can be used to dispense any process liquid, and in particular any process liquid that has a high viscosity and a short shelf life since no pump is required and therefore the chances of forming a gel in the pump is eliminated. The dispensing system utilizes a differential pressure between a first supply tank and a second buffer tank and furthermore, utilizes the gravity of the liquid for dispensing. The system can be simply constructed and is easily maintained since no pump is involved. For instance, the system can be easily dismantled and the conduit pipes soaked for cleaning.

Gel formations in the present invention novel liquid dispensing system is minimized based on the use of an inner container in the buffer tank that is made of a material permeable to gas but not to liquid such that air (or gas) on the outside can penetrate through the walls of the inner tank to inhibit the formation of gel in the material. The inner tank is further equipped with an inclined bottom for easy feeding of the liquid by gravity.

The minimization of air bubble formation in the novel liquid dispensing system is further assisted by the use of a conduit between a first container in the supply tank and a second container in the buffer tank wherein the dispensing end of the conduit in the second container is equipped with a sharp and pointed tip positioned juxtaposed to a sidewall of the container such that any agitation of the liquid is eliminated and any bubbles contained in the liquid end up floating on the liquid surface for easier venting. The conduit is further equipped with a bubble sensing device near the exit end of the first container situated in the supply tank such that when a large volume of bubbles are detected, a bubble release valve can be opened to drain a small quantity of the liquid and to exhaust the air bubbles.

Figure 1:
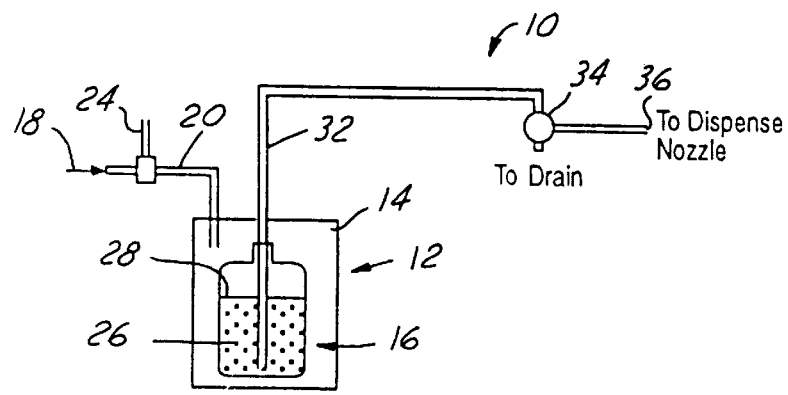
FIG. 1 is a schematic illustrating a conventional pressure feed apparatus for a process liquid that utilizes high pressure dry air.
Figure 2:
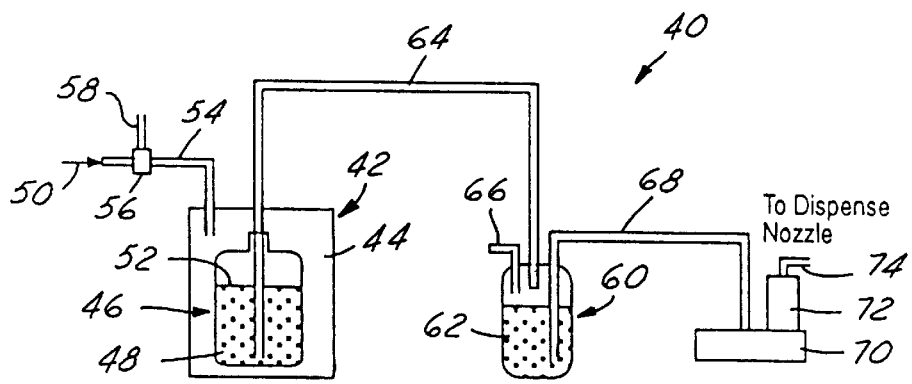
FIG. 2 is an illustration for a conventional pump feed apparatus for a process liquid that utilizes a pump to feed the liquid and a buffer tank to vent the bubbles contained in the liquid.
Figure 3:
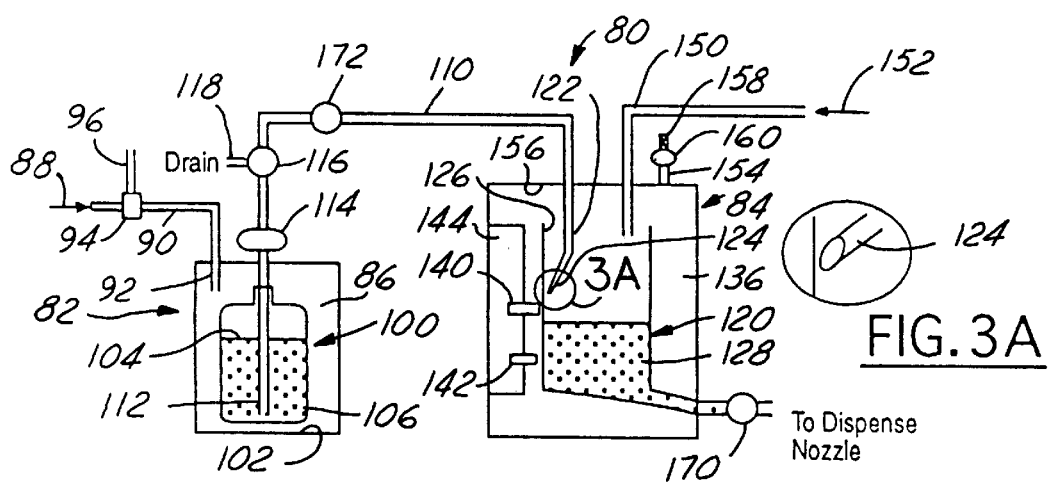
FIG. 3 is a schematic illustrating the present invention liquid dispensing system that utilizes a differential pressure between a supply tank and a buffer tank, and the gravity of the liquid for dispensing.

Referring now to FIG. 3, wherein a novel present invention apparatus 80 for dispensing a process liquid is shown. The liquid dispensing system 80 consists of mainly two tanks, i.e., a first supply tank 82 and a second buffer tank 84. The tanks are most likely constructed of a chemical resistant and high strength material such as stainless steel. In the first supply tank 80, a cavity 86 which is under a high pressure formed by a high pressure dry air flow 88 through conduit 90 and inlet 92 into the cavity 86. The conduit 90 is further equipped with a switch valve 94 which is also connected to a vent pipe 96 for venting to the atmosphere.

Inside the tank cavity 86, a first liquid container 100 is provided which is positioned on the bottom surface 102 of the first supply tank 82. The first liquid container 100 may be suitably those supplied by a commercial process liquid supplier which has an open top to allow the pressure in the first supply tank cavity 86 to act on the liquid surface 104 and thereby pressing the liquid 106 contained in the container 100 for transporting to a second container 120 situated in the second buffer tank 84. The conveying of liquid 106 into the second liquid container 120 is accomplished through a conduit pipe 110. One end 112 of the conduit pipe 110 is dipped to near the bottom of the liquid 106 such that liquid may enter the conduit under the pressure exerted by the high pressure dry air 88 and flow in the conduit pipe 110 toward the second container 120.

The conduit pipe 110 is further equipped with a bubble sensing device 114 mounted at a position close to the first supply tank 82 such that the liquid exiting the first container 110 can be closely monitored for its content of air bubbles. When air bubbles are sensed by the sensing device 114, a signal is sent to the central computer for the process machine and triggers an alarm to warn the machine operator. A valve 116 can be opened automatically by the central computer or manually by the operator to drain the bubbles through a drain pipe 118. A small amount of liquid 106 that has air bubbles can be drained from the drain pipe 118 and be discarded. Such amount is usually very small and therefore would not be a significant waste of the high cost liquid material.

At the other end 122 of the conduit pipe 110, a novel feature of the present invention is provided in a liquid dispensing end which is a sharp and pointed tip 124 positioned juxtaposed to the sidewall 126 of the second liquid container 120. It is noted that only a small volume of liquid 106 flows out of the sharp and pointed tip 124 along the sidewall 126 into the liquid 128 in the second container 120. Such a slow flow and a small volume of the liquid minimizes any potential of generating air bubbles for lack of disturbance to the liquid surface 132.

Another novel feature of the present invention liquid dispensing system 80 is the material that is used to construct the second liquid container 120. A material that is generally of a porous nature which is permeable to gas but is not permeable to liquid is used. The advantage achieved by such a material is that air entrapped in the liquid 128 may escape through the sidewalls 126 into the cavity 136 of the second buffer tank 84 and thus further minimizing the air bubble problems contained in the liquid 128. One of such suitable materials is Teflon which is also chemical resistant and suitable for most semiconductor processing liquids.

A further benefit for using a material such as Teflon is its semi-transparent nature. This allows the convenient use of liquid level sensors such as a high level sensor 140 and a low level sensor 142 shown in FIG. 3 mounted juxtaposed to the sidewall 126 of the second container 120 by a suitable mounting bracket 144. The high level sensor 140 and the low level sensor 142 are connected (not shown) to the central computer of the process machine and feed signals to the computer during the operation of the liquid dispense system 80 to suitably control the liquid level 132 in the second liquid tank 120 such that a suitable level in the tank is always maintained.

The second buffer tank 84 is further equipped with a conduit pipe 150 for supplying a second high pressure dry air flow 152 into the cavity 136 of the second buffer tank 84. The second high pressure dry air flow 152 should be lower than the first high pressure air flow 88 such that a pressure differential always exists between the first tank 82 and the second tank 84. This ensures a steady flow of process liquid 106 into the second container 120. The pressure differential should be just enough to ensure a smooth operation of the liquid dispensing system 80 and is normally larger than one atmospheric pressure.

The second buffer tank 84 is further equipped with a conduit pipe 156 mounted to a top surface 156 of the second buffer tank 84. The function of the conduit pipe 154 is to adjust and maintain a suitable pressure differential between the two tanks 82 and 84. By adjusting a pressure relief valve 158 while monitoring the differential pressure on a gauge 160, the desirable pressure differential between the first tank 82 and the second tank 84 can be suitably maintained by the machine operator. This adjustment in the differential pressure may also be suitably conducted by the central computer of the process machine.

FIG. 3A is an enlarged view of the discharging tip 124 on the end of the conveying conduit 122. The tilted and sharpened discharging tip 124 facilitates a reduction in bubble retention in the buffer tank.

The operation of the present invention novel liquid dispensing system 80 can be explained in Tables 1 and 2.

TABLE 1

| Dispense | Valve B | Valve A |
|----------|---------|---------|
| On       | On      | Off     |
| Off      | Off     | Off     |

TABLE 2

| High Level | Low Level | Value B | Valve A | Dispense |
|------------|-----------|---------|---------|----------|
| Off        | On        | On      | Off     | On       |
| Off        | On        | Off     | On      | Off      |
| On         | Off       | On      | Off     | On       |
| On         | Off       | Off     | Off     | Off      |

In Table 1, the operating mode of the present invention novel dispensing system during dispensing is shown. It is seen that during the dispensing of the liquid, the valve B (or valve 170) which adjusts a liquid flow to the dispensing nozzle (not shown) is turned on. During the dispensing, the valve A (or valve 172) in the conduit pipe 110 is closed such that the refill action for the second liquid container 120 is stopped. When the dispensing action is off, both the valve B and the valve A are shut off.

As the liquid level 132 drops below the low level sensor 142 and thereby triggers the low level sensor to send a signal to the central computer and warning the operator of a low liquid level in the second container, where the high level sensor remains off, as shown in Table 2, the valve B is turned on when the dispense action is on with the valve A turned off. This indicates a normal operating mode during which the bottle, or the first container 100 is full, and when a substrate is loaded into the process machine for a coating operation. The dispense is turned on with the valve B on for dispensing and valve A closed. The high pressure dry air flow 152 in the cavity 136 and the gravity of the liquid 128 feed the liquid flow through valve B to the dispensing nozzle (not shown).

After a dispensing is completed, the liquid level decreases in the second container 120 such that the high level sensor is off while the low level sensor is on due to the fact that the liquid level is now below the low level sensor. If a dispensing operation is still desired, valve A can be turned on with the valve B turned off, such that the second container 120 can be refilled from the first container 100. After the completion of the refill operation, the liquid level 132 in the second container 120 reaches the high level sensor 140 such that the high level sensor is turned on indicating that a desired liquid level in the second container 120 has been reached and that the refill operation can be stopped. At this time, the low level sensor is off, the valve B is turned on with the valve A turned off such that the dispensing of the liquid can be continued or turned on. After the dispensing operation, the valve A and valve B can be both turned off when the process machine is turned off. The two tanks 82 and 84 can therefore be operated independently by the suitable closing or opening of valves A and B while not effecting each others operation.

For instance, when the first container 100 in the supply tank 82 becomes empty as the liquid 106 is being filled into the second container 120 in the buffer tank 84 (at or near the end of a refill operation for the second container 120), a large volume of bubbles may come out into the conduit pipe 110 and thereby sensed by the bubble sensing device 114. A signal is sent out by the bubble sensing device to the central computer and then the valve C (or valve 116) is switched over to drain pipe 118. At the same time, valve D (or valve 94) is switched over to the vent pipe 96 such that the high pressure dry air 88 is exhausted into the atmosphere and the pressure in the cavity 86 is equalized to the atmospheric pressure. This is a safety precaution, such that the first container 100 which is now empty can be safely replaced by a machine operator.

It has been observed that whenever the first container 100 is near empty, a large volume of bubbles are exhausted from the container into the conduit pipe 110 and thereby triggering the bubble sensing device 114. This acts as a good indication for the need of the operator to replace the first container 100 with a full container. After the empty container 100 is replaced, the operator will then close the vent pipe 96 and 118, open the valve D (or valve 94) to repressurize the cavity 86 with the first high pressure dry air flow 88. It may be desirable, at this time, to again open the drain pipe 118 and to exhaust any air bubbles allowed into the system during the bottle change and then closing the drain pipe 118 by the valve C (or valve 116).

The present invention novel liquid dispensing system can be used to dispense any process liquid that is normally used in semiconductor processing or any other processes. However, the present invention novel liquid dispensing system is especially suitable for use in dispensing liquids that are normally of high viscosity and of short shelf life. For instance, in the semiconductor fabrication process, the dispensing of polyimide as a final overcoating material can be suitably dispensed by the present invention novel system. The high viscosity and short shelf life polyimide liquid can be suitably dispensed by the system and no gel formation occurs due to the fact that no pumping system is used to allow a dead space in the system.

When such polyimide is dispensed in the present invention novel system, for instance, in a commercially supplied quantity of 500 gm bottles, approximately twice a day the bottle needs to be changed after the previous one is used up. The replacement frequency obviously depends on several processing parameters, such as the quantity of liquid dispensed on each substrate or wafer, the thickness of coating desired, and the number of substrates processed during a unit time. A suitable coating of polyimide may be in the range between about 50 Å and about 1,000 Å thickness. The present invention novel dispensing system can be used to dispense a liquid in forming a solid film of any thicknesses. The viscosity of a polyimide that is normally used in semiconductor processing is approximately 3,000 cps and is normally processed under a differential pressure between about 0.5 and about 2 kg/cm$^2$.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

We claim:

1. A liquid dispensing system comprising:
   a first tank hermetically sealed under a first pneumatic pressure,
   a first container situated in said first tank for holding a liquid under said first pneumatic pressure,
   a second tank hermetically sealed under a second pneumatic pressure smaller than said first pneumatic pressure,
   a second container situated inside said second tank for holding said liquid under said second pneumatic pressure,
   a first conduit for fluid communication between said first container and said second container, and
   an inclined bottom in said second container for dispensing said liquid by gravity through a second conduit connected to the lowest point in said inclined bottom.

2. A system according to claim 1 further comprising means for pressurizing said first tank to said first pneumatic pressure and for venting said first tank to atmospheric pressure.

3. A system according to claim 1, wherein said first conduit for providing fluid communication between said first container and said second container further comprising bubble sensing means and bubble releasing means.

4. A system according to claim 1, wherein said first conduit for providing fluid communication between said first container and said second container further comprising a first shut-off valve.

5. A system according to claim 1, wherein said second conduit further comprising a second shut-off valve situated between said inclined bottom of said second container and a dispensing nozzle.

6. A system according to claim 1, wherein said first conduit further comprising a discharging means at one end of the conduit for discharging liquid into said second container, said discharging means substantially reduces the chances of bubbles being generated during the filling of said second container.

7. A system according to claim 6, wherein said discharging means comprises a sharp and pointed tip.

8. A system according to claim 1, wherein said second container being made of a material having sufficient porosity such that gel formation in said liquid is prevented.

9. A system according to claim 8, wherein said second container comprises Teflon walls and bottom.

10. A system according to claim 1, wherein said second container further comprising liquid level sensing means.

11. A system according to claim 1, wherein said second container further comprising a high level sensor and a low level sensor for sensing the liquid level in said container.

12. A liquid dispensing system for high viscosity liquids comprising:
    a first tank hermetically sealed under a first pneumatic pressure and equipped with means for pressurizing and for venting said tank,
    a first container situated in said first tank for holding a liquid under said first pneumatic pressure,
    a second tank hermetically sealed under a second pneumatic pressure smaller than said first pneumatic pressure equipped with means for pressuring and venting said tank,
    a second container situated inside said second tank for holding said liquid under said second pneumatic pressure equipped with an inclined bottom and a discharging conduit at the lowest point of said inclined bottom, and
    a conveying conduit providing a fluid communication between said first container and said second container equipped with a vent valve and a first shut-off valve.

13. A system according to claim 12, wherein said conveying conduit further comprising bubble sensing means for detecting the presence of bubbles in said conduit.

14. A system according to claim 12, wherein said discharging conduit further comprising a second shut-off valve.

15. A system according to claim 12, wherein said conveying conduit further comprising a discharging means at one end of the conduit for discharging liquid into said second container substantially without air bubbles.

16. A system according to claim 15, wherein said discharging means comprises a sharp and pointed tip.

17. A system according to claim 12, wherein said second container being made of a material that is permeable to gas but not to liquid.

18. A system according to claim 12, wherein said second container further comprising at least one liquid level sensor, and preferably two liquid level sensors.

19. A method for dispensing a liquid comprising the steps of:
    pressurizing a first hermetically sealed tank to a first pneumatic pressure,
    filling a first container situated in said first tank with a liquid such that said liquid is under said first pneumatic pressure,
    pressurizing a second hermetically sealed tank to a second pneumatic pressure lower than said first pneumatic pressure, said second tank having a second container therein for receiving a liquid through a first conduit from said first container and subjecting said liquid to said second pneumatic pressure, and
    dispensing said liquid by gravity and said second pneumatic pressure into a second conduit in fluid communication with the lowest point of an inclined bottom of said second container.

20. A method according to claim 19 further comprising the step of venting said first tank to atmospheric pressure when liquid in said first container is substantially conveyed to said second container such that a replacement said first container is required.

21. A method according to claim 19 further comprising the steps of monitoring bubbles in said first conduit by a bubble sensing means mounted juxtaposed to said conduit and venting said bubbles through a vent valve.

22. A method according to claim 19 further comprising the step of closing a shut-off valve in said first conduit when liquid is dispensed through said second conduit.

23. A method according to claim 19 further comprising the step of providing a pressurizing means and a vent means in said second tank for achieving said second pneumatic pressure.

24. A method according to claim 19, wherein said liquid is filled into said second container substantially without air bubbles through a sharp and pointed tip in said first conduit.

25. A method according to claim 19 further comprising the step of venting trapped air in said liquid through walls of said second container made of a material substantially permeable to gas but not to liquid.

* * * * *